US011183627B2

(12) United States Patent
Chen et al.

(10) Patent No.: US 11,183,627 B2
(45) Date of Patent: Nov. 23, 2021

(54) MRAM MTJ TOP ELECTRODE CONNECTION

(71) Applicant: Taiwan Semiconductor Manufacturing Co., Ltd., Hsin-Chu (TW)

(72) Inventors: Sheng-Chau Chen, Tainan (TW); Cheng-Tai Hsiao, Tainan (TW); Cheng-Yuan Tsai, Chu-Pei (TW); Hsun-Chung Kuang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/732,385

(22) Filed: Jan. 2, 2020

(65) Prior Publication Data
US 2020/0144484 A1    May 7, 2020

Related U.S. Application Data

(63) Continuation of application No. 16/051,759, filed on Aug. 1, 2018, now Pat. No. 10,529,913.

(60) Provisional application No. 62/691,244, filed on Jun. 28, 2018.

(51) Int. Cl.
    *H01L 27/22*   (2006.01)
    *H01L 43/02*   (2006.01)
    *H01L 43/12*   (2006.01)

(52) U.S. Cl.
    CPC .......... *H01L 43/02* (2013.01); *H01L 27/222* (2013.01); *H01L 43/12* (2013.01)

(58) Field of Classification Search
    CPC .......... H01L 43/02; H01L 43/08; H01L 43/12; H01L 27/222; H01L 27/228
    See application file for complete search history.

(56) References Cited

U.S. PATENT DOCUMENTS

| 9,954,166 | B1 | 4/2018 | Lin et al. | |
| 10,008,538 | B2 | 6/2018 | Chuang et al. | |
| 10,163,651 | B1* | 12/2018 | Chen | H01L 21/31055 |
| 10,529,913 | B1* | 1/2020 | Chen | H01L 27/228 |
| 2010/0178714 | A1* | 7/2010 | Cho | G11C 11/161 |
| | | | | 438/3 |

(Continued)

OTHER PUBLICATIONS

Non-Final Office Action dated Oct. 2, 2019 for U.S. Appl. No. 16/051,759.

(Continued)

*Primary Examiner* — Ismail A Muse
*Assistant Examiner* — Gustavo G Ramallo
(74) *Attorney, Agent, or Firm* — Eschweiler & Potashnik, LLC (57) ABSTRACT

Some embodiments relate to a memory device. The memory device includes a memory cell overlying a substrate, the memory cell includes a data storage structure disposed between a lower electrode and an upper electrode. An upper interconnect wire overlying the upper electrode. A first inter-level dielectric (ILD) layer surrounding the memory cell and the upper interconnect wire. A second ILD layer overlying the first ILD layer and surrounding the upper interconnect wire. A sidewall spacer laterally surrounding the memory cell. The sidewall spacer has a first sidewall abutting the first ILD layer and a second sidewall abutting the second ILD layer.

20 Claims, 8 Drawing Sheets

(56) References Cited

U.S. PATENT DOCUMENTS

| 2013/0119494 A1 | 5/2013 | Li et al. |
| 2015/0092481 A1* | 4/2015 | Lee .................. G11C 11/15 |
| | | 365/158 |
| 2015/0263267 A1 | 9/2015 | Kanaya |
| 2016/0028000 A1 | 1/2016 | Tsai et al. |
| 2017/0148849 A1* | 5/2017 | Chuang ............... H01L 43/12 |
| 2017/0222128 A1* | 8/2017 | Sung ................ H01L 27/228 |
| 2019/0165041 A1* | 5/2019 | Chuang .............. H01L 27/228 |

OTHER PUBLICATIONS

Notice of Allowance dated Nov. 18, 2019 for U.S. Appl. No. 16/051,759.

* cited by examiner

MRAM MTJ TOP ELECTRODE CONNECTION

REFERENCE TO RELATED APPLICATIONS

This Application is a Continuation of U.S. application Ser. No. 16/051,759, filed on Aug. 1, 2018, which claims the benefit of U.S. Provisional Application No. 62/691,244, filed on Jun. 28, 2018. The contents of the above-referenced Patent Applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded magnetoresistive random-access memory (MRAM) cells are typically disposed in an embedded memory region adjacent to a logic region comprising transistor devices (e.g., MOSFET devices). Within the embedded memory region, an MRAM cell is generally located within an ILD structure surrounding stacked interconnect layers over a substrate. The MRAM cell includes a magnetic tunnel junction (MTJ) arranged between top and bottom electrodes. The bottom electrode is coupled to the stacked interconnect layers by a bottom electrode via while the top electrode is coupled to the stacked interconnect layers by a top electrode via. Within the logic region, the stacked interconnect layers are coupled to the transistor devices and have an interconnect via laterally offset from the MRAM cell.

In conventional MRAM cell fabrication, the top electrode via is formed by etching a first inter-level dielectric (ILD) arranged over the top electrode to form a via hole over the top electrode. The via hole is subsequently filled with one or more conductive materials. A photoresist mask is then formed over the conductive material and is used to pattern a top electrode via landing on the top electrode. Overlying metal wires are subsequently formed within a second ILD layer on the top electrode via and on the interconnect via of the logic region.

It has been appreciated that after coupling the top electrode via to the overlying metal wires, a thickness of the metal wire over the MRAM cell in the embedded memory region is smaller than a thickness of the metal wire over the interconnect via in the logic region. The smaller thickness of the metal wire over the MRAM cell can cause processing issues. For example, the overlying metal wires are generally formed using a damascene process that performs a chemical-mechanical planarization (CMP) process after filling a trench within the second ILD layer with conductive materials. However, if the metal wire over the MRAM cell is too thin (e.g., less than approximately 400 Angstroms), the CMP process window is small and can result in damage to the top electrode of the MRAM cell.

The present disclosure, in some embodiments, relates to a method of forming a MRAM cell that couples a top electrode of the MRAM cell directly to an overlying interconnect wire layer. Coupling the top electrode of the MRAM cell directly to the overlying interconnect wire layer provides for a relatively thick metal wire layer (e.g., having a thickness of greater than or equal to approximately 600 Angstroms), and thereby removes potential processing issues related to a thickness of the interconnect wire layer. It also eliminates steps/material used to form the top electrode via, thereby simplifying the fabrication of the MRAM cell and reducing a cost of the MRAM cell. For example, forming the interconnect wire layer directly onto the top electrode can save two photomasks compared to MRAM cells that use a top electrode via.

Figure 1A:
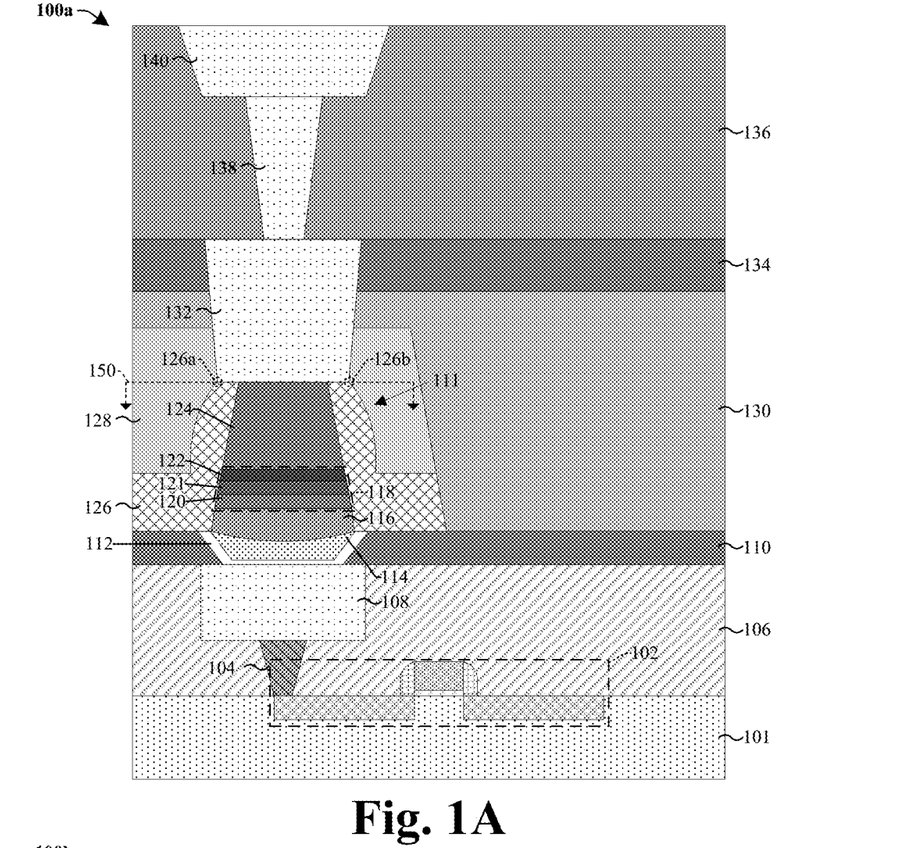
FIG. 1A illustrates a cross-sectional view of some embodiments of a memory device including a MRAM cell having a magnetic tunneling junction (MTJ), according to the present disclosure.

Referring to FIG. 1A, a cross-sectional view of a memory device 100a in accordance with some embodiments is provided.

The memory device 100a includes a substrate 101 with a first inter-level dielectric (ILD) layer 106 disposed over the substrate 101. A transistor 102 is within the substrate 101 and the first ILD layer 106. A magnetoresistive random-access memory (MRAM) cell 111 is connected to the transistor 102 via a conductive contact 104 and an interconnect wire 108 disposed over the conductive contact 104.

The MRAM cell 111 comprises a lower electrode 116 disposed over a diffusion barrier 112 surrounding a lower metal layer 114. The MRAM cell 111 further includes an upper electrode 124, which is separated from the lower electrode 116 by a magnetic tunnel junction (MTJ) 118. The lower metal layer 114 and diffusion barrier 112 are disposed within a lower dielectric layer 110. The MTJ 118 includes a lower ferromagnetic electrode 120 and an upper ferromagnetic electrode 122, which are separated from one another by a tunneling barrier layer 121. In some embodiments, the lower ferromagnetic electrode 120 can have a fixed or "pinned" magnetic orientation, while the upper ferromagnetic electrode 122 has a variable or "free" magnetic orientation, which can be switched between two or more distinct magnetic polarities that each represents a different data state, such as a different binary state. In other implementations, however, the MTJ 118 can be vertically "flipped", such that the lower ferromagnetic electrode has a "free" magnetic orientation, while the upper ferromagnetic electrode 122 has a "pinned" magnetic orientation.

In some embodiments, the upper ferromagnetic electrode 122 comprises iron, cobalt, nickel, iron cobalt, nickel cobalt, cobalt iron boride, iron boride, iron platinum, iron palladium, or the like. In some embodiments, the tunneling barrier layer 121 provides electrical isolation between the upper ferromagnetic electrode 122 and the lower ferromagnetic electrode 120, while still allowing electrons to tunnel through the tunneling barrier layer 121 under proper conditions. The tunneling barrier layer 121 may comprise, for example, magnesium oxide (MgO), aluminum oxide (e.g., $Al_2O_3$), nickel oxide, gadolinium oxide, tantalum oxide, molybdenum oxide, titanium oxide, tungsten oxide, or the like.

An upper interconnect wire 132 is disposed directly on the upper electrode 124. In some embodiments, the upper interconnect wire 132 may comprise one or more liners (e.g., a diffusion barrier layer) surrounding a conductive metal (e.g., copper, aluminum, or the like). The sidewall spacer 126 and upper interconnect wire 132 are surrounded by a second ILD layer 128. A third ILD layer 130 surrounds the sidewall spacer 126, the second ILD layer 128, and partially surrounds the upper interconnect wire 132. A sidewall spacer 126 surrounds the MRAM cell 111. In some embodiments, the upper interconnect wire 132 has a bottom surface that contacts an upper surface of the upper electrode 124. The bottom surface of the upper interconnect wire 132 extends along an interface continuously extending from a first outer edge 126a of the sidewall spacer 126 to a second outer edge 126b of the sidewall spacer 126. In some embodiments, the interface is a substantially level horizontal line extending along an upper surface of the sidewall spacer 126 and the upper surface of the upper electrode 124. In other embodiments, the interface may be non-planar. When viewed from a top view, the sidewall spacer 126 may have a round shape with a curved outer surface. Therefore, the first outer edge 126a and the second outer edge 126b are identified from a cross-sectional view.

An upper dielectric layer 134 is disposed over the third ILD layer 130 and laterally surrounds the upper interconnect wire 132. A second conductive via 138 is disposed over the upper interconnect wire 132. In some embodiments, the second conductive via 138 may be comprised of copper, aluminum, or the like. A second conductive wire 140 is disposed over the second conductive via 138. In some embodiments, the second conductive wire 140 may be comprised of copper, aluminum, or the like. A fourth ILD layer 136 surrounds the second conductive wire 140 and the second conductive via 138. The second conductive wire 140 extends past sidewalls of the second conductive via 138.

A dashed line 150 is aligned with an upper surface of the upper electrode 124 and an upper surface of the sidewall spacer 126. The dashed line crosses through the second ILD layer 128.

Having the upper interconnect wire 132 directly contact the upper electrode 124, allows for the upper interconnect wire 132 to have a relatively large thickness (e.g., a thickness greater than or equal to approximately 600 angstroms). This relatively large thickness mitigates potential processing issues related to the thickness of the upper interconnect wire 132. Having the upper interconnect wire 132 directly contact the upper electrode 124 also reduces a cost of fabricating the MRAM cell by simplifying the fabrication of the MRAM cell (e.g., by eliminating photomasks used to pattern a top electrode via).

Figure 1B:
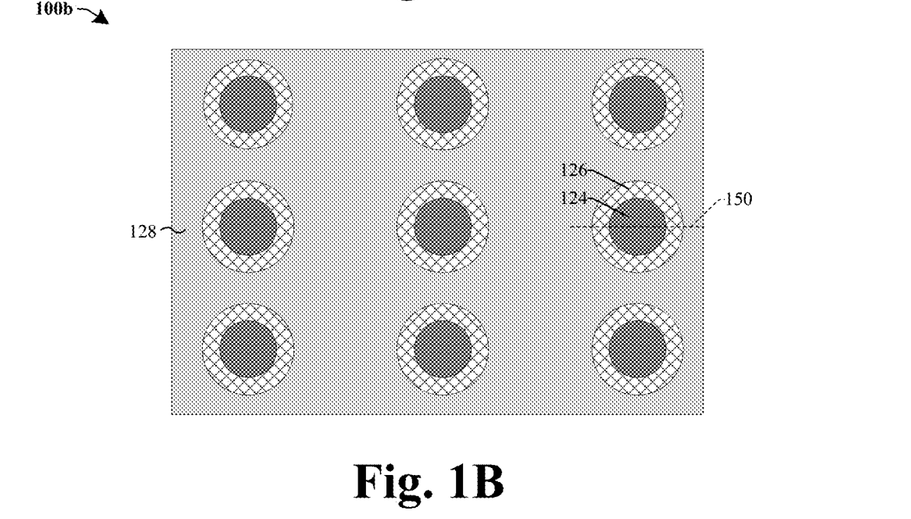
FIG. 1B illustrates a top view of some embodiments of a plurality of memory devices including MRAM cells having magnetic tunneling junctions (MTJs), according to the present disclosure.

FIG. 1B illustrates a top view of some additional embodiments of a memory device 100b.

Figure 2:
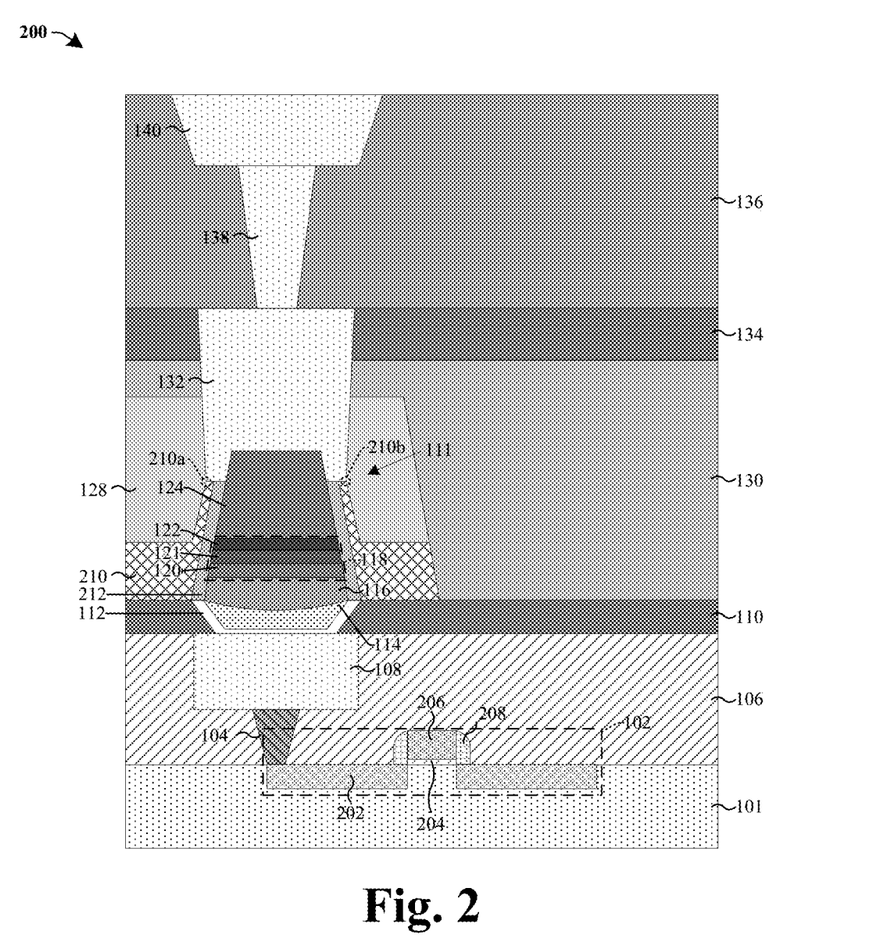
FIG. 2 illustrates a cross-sectional view of some embodiments of a memory device including a MRAM cell having a magnetic tunneling junction (MTJ), according to the present disclosure.

The memory device 100b comprises a plurality of MRAM cells arranged in rows and columns. It will be appreciated memory arrays can include any number of MRAM cells and thus FIG. 1b is merely an example. The upper electrode 124 is arranged in the center of the sidewall spacer 126. The dashed line 150 from FIG. 1a shows the location of the top view cut from the memory device 100a. The sidewall spacer 126 has a round shape with a curved outer surface FIG. 2 illustrates a cross-sectional view of some additional embodiments of a memory device 200.

The memory device 200 comprises a transistor 102 within the substrate 101 and a first ILD layer 106. The substrate 101 may be, for example, a bulk substrate (e.g., a bulk silicon substrate) or a silicon-on-insulator (SOI) substrate. The transistor 102 is comprised of a gate electrode 206, transistor sidewall spacers 208, a gate dielectric 204, and source/drain regions 202. An interconnect wire 108 is connected to the transistor 102 via a conductive contact 104. In some embodiments, the interconnect wire 108 may be comprised of aluminum, copper, or the like. In some embodiments, the conductive contact 104 may comprise tungsten, copper, or the like.

In some embodiments, the sidewall spacer 126 is comprised of two portions, a first sidewall spacer 212 and a second sidewall spacer 210. Inner sidewalls of the first sidewall spacer 212 are in direct contact with outer sidewalls of the MRAM cell 111. A bottom surface of the first sidewall spacer 212 is in direct contact with a top surface of the diffusion barrier 112. Inner sidewalls of the second sidewall spacer 210 are in direct contact with outer sidewalls of the first sidewall spacer 212. The second sidewall spacer 210 extends over the lower dielectric layer 110. In some embodiments, the first sidewall spacer 212 may be comprised of silicon nitride (SiN). In some embodiments, the second sidewall spacer 210 may be comprised of silicon oxynitride (SiON).

The upper interconnect wire 132 is in direct contact with an upper surface of the upper electrode 124 along an interface continuously extending between outermost sidewalls of the upper electrode 124. In some embodiments, the upper interconnect wire 132 may further extend from a first outer edge 210a of the second sidewall spacer 210 to a second outer edge 210b of the second sidewall spacer 210. In such embodiments, the upper interconnect wire 132 is in direct contact with an uppermost surface of the first sidewall spacer 212 and an uppermost surface of the second sidewall spacer 210. In some embodiments, an upper surface of the first sidewall spacer 212, an upper surface of the second sidewall spacer 210, and an upper surface of the upper electrode 124 contact a horizontal line. A bottom surface of the upper interconnect wire 132 contacts the upper surface of the first sidewall spacer 212, the second sidewall spacer 210, and the upper electrode 124 at the horizontal line. In other embodiments, the upper surfaces of the first sidewall spacer 212, the second sidewall spacer 210, and the upper electrode 124 have different heights. When viewed from a top view, the first sidewall spacer 212 and second sidewall spacer 210 may have a round shape with a curved outer surface. Therefore, the first outer edge 210a and the second outer edge 210b are identified from a cross-sectional view.

Figure 3:
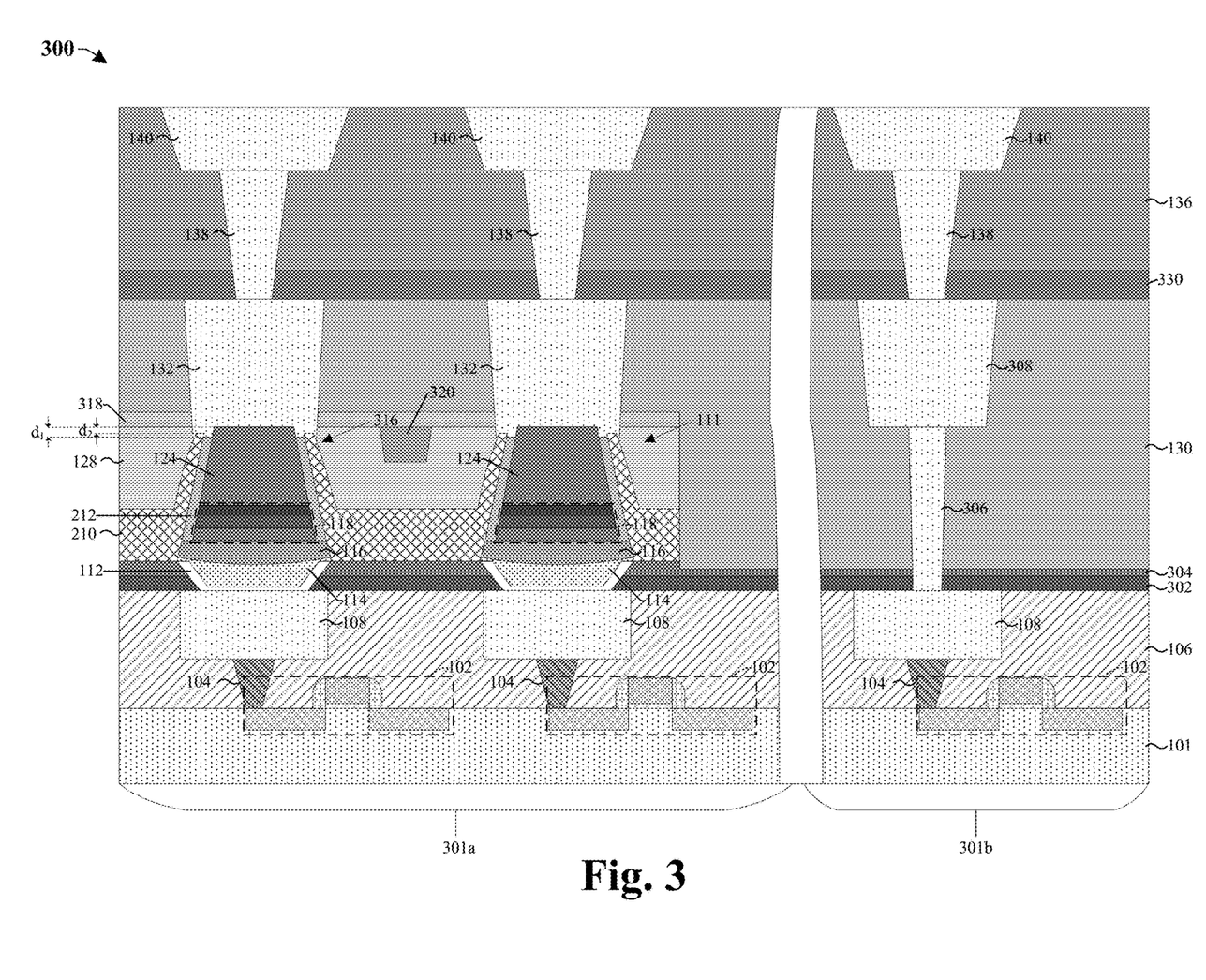
FIG. 3 illustrates a cross-sectional view of some embodiments of a memory device including an embedded memory region comprising two MRAM cells each having a magnetic tunneling junction (MTJ) and a logic region, according to the present disclosure.

FIG. 3 illustrates a cross-sectional view of some additional embodiments of a memory device 300 having an embedded memory region 301a and a logic region 301b.

The memory device 300 comprises a dielectric layer 302 disposed over a interconnect wire 108 and a first ILD layer 106. In some embodiments, the dielectric layer 302 may comprise a silicon carbide (SiC) layer, for example. A first etch stop layer 304 is disposed over the dielectric layer 302. In some embodiments, the first etch stop layer 304 may comprise a silicon-rich oxide layer, for example. In the logic region 301b, a third ILD layer 130 is disposed over the first etch stop layer 304. In some embodiments, the third ILD layer 130 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In some embodiments, the third ILD layer 130 comprises a different material than a second ILD layer 128 that surrounds the MRAM cell 111. In some embodiments, the second ILD layer 128 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. A second conductive via 306 is disposed over the interconnect wire 108 at a location laterally offset from the MRAM cell 111. A second interconnect wire 308 is disposed over the second conductive via 306. The second interconnect wire 308 is partially surrounded by the third ILD layer 130 and extends past sidewalls of the second conductive via 306. In some embodiments, the second conductive via 306 and the second interconnect wire 308 may be comprised of copper, aluminum, or the like. A second etch stop layer 330 is disposed over the third ILD layer 130. In some embodiments, the second etch stop layer 330 may comprise a silicon carbide (SiC) layer, for example.

In the embedded memory region 301a, a first MRAM cell 111 is disposed between the interconnect wire 108 and the upper interconnect wire 132. A third etch stop layer 318 is disposed over the second ILD layer 128. The third etch stop layer 318 partially surrounds the upper interconnect wire 132. In some embodiments, the third etch stop layer 318 may comprise a silicon carbide (SiC) layer, for example. A top surface of the lower metal layer 114 and a top surface of the first etch stop layer 304 are defined by a horizontal line. In some embodiments, the lower metal layer 114 may have a curved upper surface that dishes below a level horizontal line.

In some embodiments, a bottom surface of the first sidewall spacer 212 is in direct contact with a top surface of the lower electrode 116. The first sidewall spacer 212 is defined by a first height measured from the top surface of the lower electrode 116 to the upper most surface of the first sidewall spacer 212. In some embodiments, the second sidewall spacer 210 is defined by a second height measured from the top surface of the lower electrode 116 to the upper most surface of the second sidewall spacer 210. The second height is greater than the first height. The difference between the first height and the second height is due to irregularities within a selectivity etch process used to form the upper interconnect wire 132. The difference in height causes a distance $d_1$ from the upper most surface of the first sidewall spacer 212 to an upper most surface of the upper electrode 124 is less than a distance $d_2$ from the upper most surface of the second sidewall spacer 210 to the upper most surface of the upper electrode 124. In other embodiments, the first height is greater than the second height (not shown). In some embodiments, the upper interconnect wire 132 partially covers a portion of outer sidewalls of the second sidewalls spacer 210. The upper interconnect wire 132 extends past and covers the upper most surface of the second sidewall spacer 210.

A second MRAM cell 316 is disposed between an interconnect wire 108 and an upper interconnect wire 132. A third etch stop layer 318 is disposed over the second ILD layer 128. The third etch stop layer 318 partially surrounds the upper interconnect wire 132. The second MRAM cell 316 is spaced laterally from the first MRAM cell 111. The second sidewall spacer 210 and the second ILD layer 128 are disposed between the second MRAM cell 316 and the first MRAM cell 111. In some embodiments, a remnant 320 of a dielectric protection layer is disposed between the first and second MRAM cells within the second ILD layer 128. The remnant of the dielectric protection layer is caused by the dielectric protection layer material filling a recess within the second ILD layer 128 that is between the first MRAM cell 111 and the second MRAM cell 316 (due to the heights of the first MRAM cell 111 and the second MRAM cell 316 relative to the first etch stop layer 304). A top surface of the remnant 320 and a top surface of the second ILD layer 128 are defined by a horizontal line. The top surface of the remnant 320 contacts a lower surface of the third etch stop layer 318.

In the logic region 301b, the fourth ILD layer 136 is disposed over the second etch stop layer 330. A second conductive via 138 is disposed over the second interconnect wire 308. A second conductive wire 140 is disposed over the second conductive via 138. The fourth ILD layer 136 surrounds the second conductive wire 140 and the second conductive via 138. The second conductive wire 140 extends past sidewalls of the second conductive via 138.

In some embodiments, the MRAM cell 111 within the embedded memory region 301a may be comprised within an array having a plurality of MRAM cells arranged in rows and columns. The first sidewall spacer 212 and second sidewall spacer 210 of a first one of the plurality of MRAM cells may have different heights (e.g., as shown in FIG. 3), while the first sidewall spacer 212 and second sidewalls spacer 210 of a second one of the plurality of MRAM cells may have a substantially same height (e.g., as shown in FIG. 2). The difference in height in the first one of the plurality of MRAM cells is due to irregularities within a selectivity etch process used to form the MRAM cells.

FIGS. 4-11 illustrate cross-sectional views 400-1100 of some embodiments of a method of forming a memory device including an embedded memory region comprising a MRAM cell and MTJ, and a logic region according to the present disclosure. Although the cross-sectional views 400-1100 shown in FIGS. 4-11 are described with reference to a method, it will be appreciated that the structures shown in FIGS. 4-11 are not limited to the method but rather may stand alone separate of the method. Although FIGS. 4-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
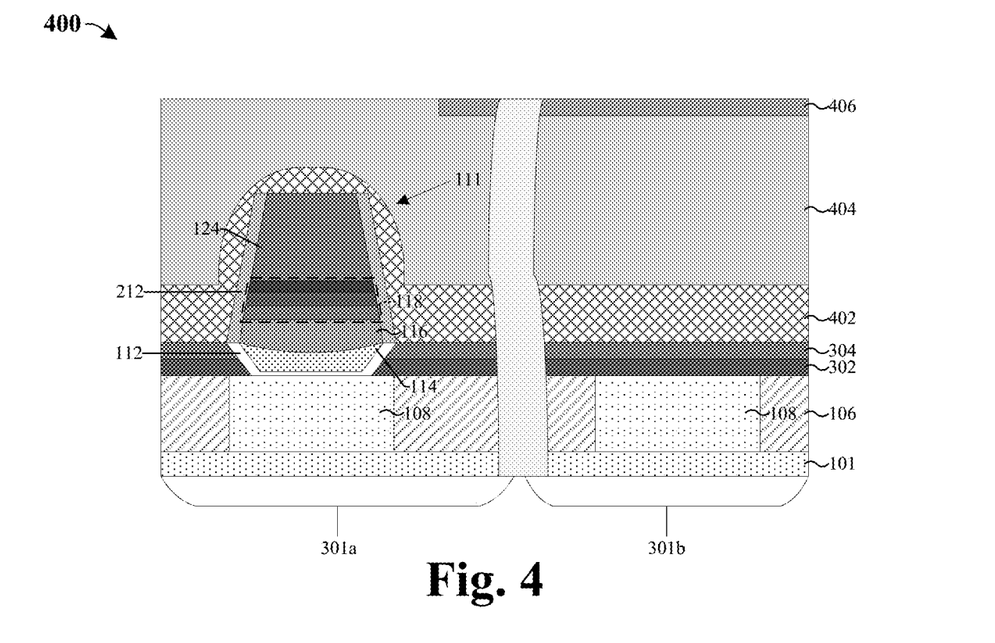
FIGS. 4-11 illustrate cross-sectional views of some embodiments of a method of forming a memory device including an embedded memory region comprising a MRAM cell having a MTJ and a logic region, according to the present disclosure.

As shown in cross-sectional view 400 of FIG. 4, a first ILD layer 106 is formed over a substrate 101. A conductive contact 104 and an interconnect wire 108 are formed within the first ILD layer 106 in the embedded memory region 301a and in the logic region 301b. In some embodiments, the conductive contact 104 and the interconnect wire 108 may be formed by way of damascene processes. A dielectric layer 302 is formed over the interconnect wire 108 and the first ILD layer 106. In some embodiments, the dielectric layer 302 comprises SiC (silicon carbide), silicon nitride, or the like. A first etch stop layer 304 is formed over the dielectric layer 302. In some embodiments, the first etch stop layer 304 comprises silicon rich oxide.

Within the embedded memory region 301a, a MRAM cell 111 is formed over the interconnect wire 108. The MRAM cell 111 comprises a lower electrode 116 disposed over a diffusion barrier 112 surrounding a lower metal layer 114. The MRAM cell 111 further includes an upper electrode 124, which is separated from the lower electrode 116 by a magnetic tunnel junction (MTJ) 118. In some embodiments, the lower electrode 116 and the upper electrode 124 may comprise a conductive material, such as, titanium nitride, tantalum nitride, titanium, tantalum, or a combination of one or more of the foregoing. Sidewalls of the MTJ 118 can be angled at an angle of other than 90-degrees as measured relative to a normal line passing through an upper surface of the lower electrode 116. Although the MRAM cell 111 is illustrated in FIG. 4 as being over a first interconnect wire, it will be appreciated that in other embodiments, the MRAM cell 111 may be located at other positions within a back-end-of-the-line (BEOL) metallization stack (e.g., the MRAM cell 111 may be between a second and third interconnect wire, between a third and fourth interconnect wire, etc.).

Within the embedded memory region 301a, a first sidewall spacer 212 is formed along outer sidewalls of the lower electrode 116, the MTJ 118, and the upper electrode 124. Within the embedded memory region 301a and the logic region 301b, a second sidewall spacer layer 402 is formed over the MRAM cell 111 and over the first etch stop layer 304. Outermost sidewalls of the first sidewall spacer 212 are surrounded by inner sidewalls of the second sidewall spacer layer 402. A second ILD 404 is formed over the second sidewall spacer layer 402. In some embodiments, a dielectric protection layer 406 is formed over the second ILD 404 in the logic region 301b. In some embodiments, the dielectric protection layer 406 is partially formed over a portion of the second ILD 404 in the embedded memory region 301a. In some embodiments, the dielectric protection layer 406 comprises silicon oxynitride (SiON). The dielectric protection layer 406 is used as a CMP stop layer, protecting the second ILD 404 below the dielectric protection layer 406. In some embodiments, a CMP process is performed up to an upper surface of the dielectric protection layer 406 to remove any excess material in the memory region 301a (not shown).

Figure 5:
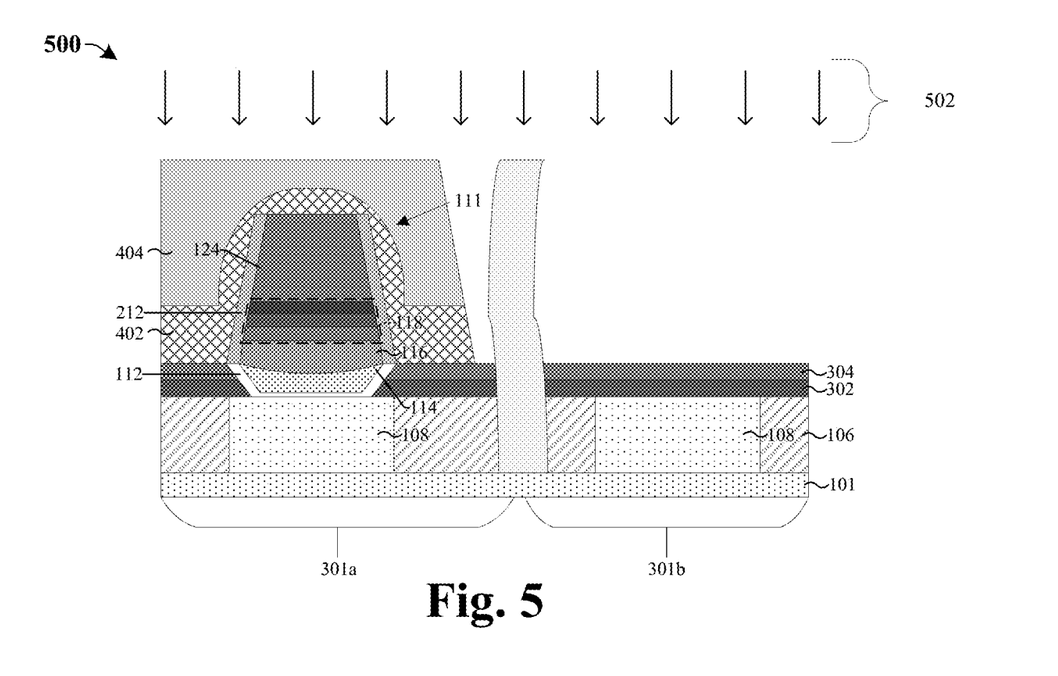

As shown in cross-sectional view 500 of FIG. 5, an etching process is performed to etch the second sidewall spacer layer 402, the second ILD 404, and the dielectric protection layer 406. In some embodiments, the etching process may be performed by forming a masking layer (not shown) over the second ILD 404 and subsequently exposing unmasked areas of the second ILD 404 to an etchant 502.

In some embodiments, the etching process etches the second ILD layer 404 exposing an upper surface of the second sidewall spacer layer 402 directly above the MRAM cell 111. Additionally, the etching process etches the second sidewall spacer layer 402, the dielectric protection layer 406, and a portion of the first etch stop layer 304. An upper surface of the second ILD layer 404 and the upper surface of the second sidewall spacer layer 402 directly above the MRAM cell 111 contact a horizontal line. A third etch stop layer is disposed over the upper surface of the second sidewall spacer layer 402 and the upper surface of the second ILD layer 404 (not shown).

In some embodiments, the MRAM cell 111 within the embedded memory region 301a may be comprised within an array having a plurality of MRAM cells arranged in rows and columns. A remnant of the dielectric protection layer 406 would form between each set of MRAM cells in the array (not shown). The remnant would be formed within the second ILD layer 404.

Figure 6:
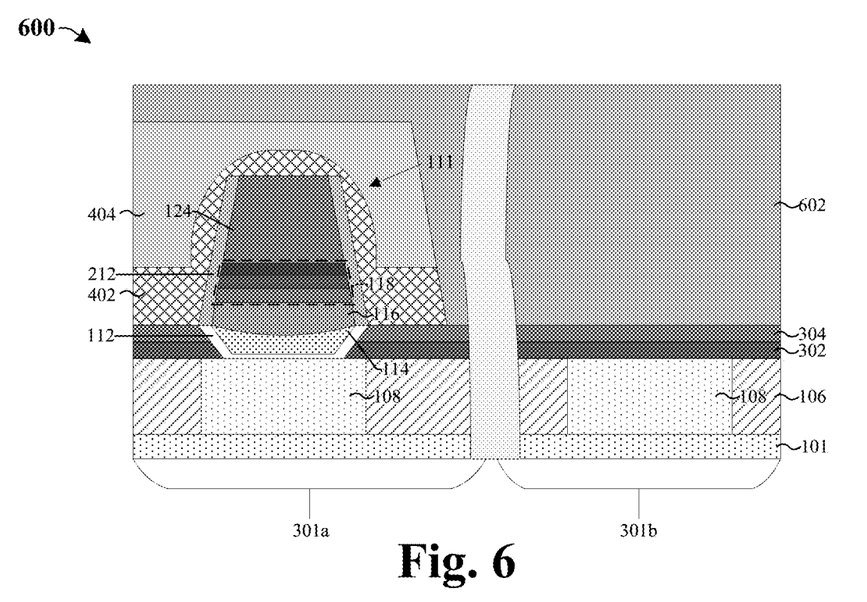

As shown in cross-sectional view 600 of FIG. 6, a third ILD 602 is formed over the second ILD 404, the second sidewall spacer layer 402, and the first etch stop layer 304. In some embodiments, an etch back process (not shown) is performed to remove excess material in the embedded memory region 301a forming the third ILD 602. After performing the etch back process, the third ILD 602 has a thickness in a range of between approximately 350 Angstroms and approximately 450 Angstroms from a top most surface of the second ILD 404 to a top most surface of the third ILD 602 and a thickness in a range of between approximately 1600 Angstroms and approximately 1800 Angstroms from a top most surface of the first etch stop layer 304 to the top most surface of the third ILD 602.

Figure 7:
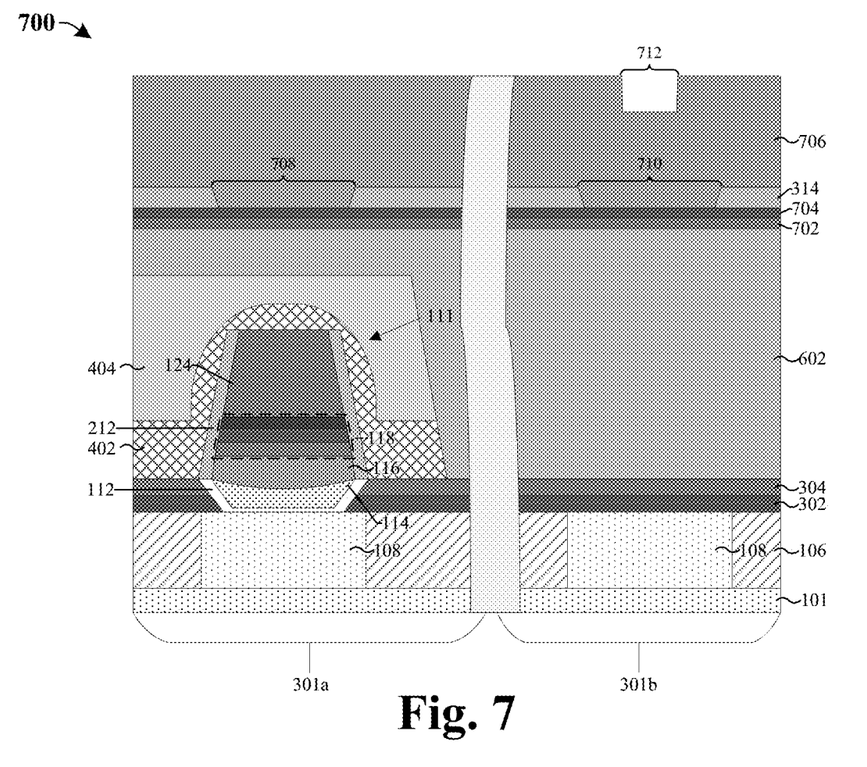

As shown in cross-sectional view 700 of FIG. 7, a second dielectric 702 is formed over the third ILD 602. In some embodiments, the second dielectric 702 may comprise a tetra-ethyl-ortho-silicate (TEOS) layer, for example. A third dielectric 704 is formed over the second dielectric 702. In some embodiments, the third dielectric 704 is a nitrogen free anti-reflective layer comprising a silicon oxide layer having a thickness in a range of between approximately 150 Angstroms and approximately 250 Angstroms. A masking layer 314 is formed over the third dielectric 704. In some embodiments, the masking layer 314 may comprise a titanium nitride (TiN) layer having a thickness in a range of between approximately 300 Angstroms and approximately 400 Angstroms. The masking layer 314 comprises a first set of sidewalls directly above the upper electrode 124 defining a first opening 708 and a second set of sidewalls directly above the interconnect wire 108 in the logic region 301b defining a second opening 710. The openings 708 and 710 at an upper surface of the masking layer 314 have a first width, the surface at the bottommost point of the openings 708 and 710 in the masking layer 314 has a second width, and the first width is greater than the second width. A second masking layer 706 is formed over the masking layer 314 and the third dielectric 704. The second masking layer 706 comprises a third set of sidewalls directly above the interconnect wire 108 in the logic region 301b defining a third opening 712.

In some embodiments, the second masking layer 706 includes a photoresist mask. In other embodiments, the second masking layer 706 may comprise a hardmask layer (e.g., comprising a nitride layer). In some embodiments, the second masking layer 706 may comprise a multi-layer hard mask. For example, in some embodiments, the masking layer may comprise a dual-layer hard mask having an upper-layer and a lower-layer. In some embodiments, the lower-layer comprises a titanium nitride (TiN) layer and the upper-layer comprises TEOS.

Figure 8:
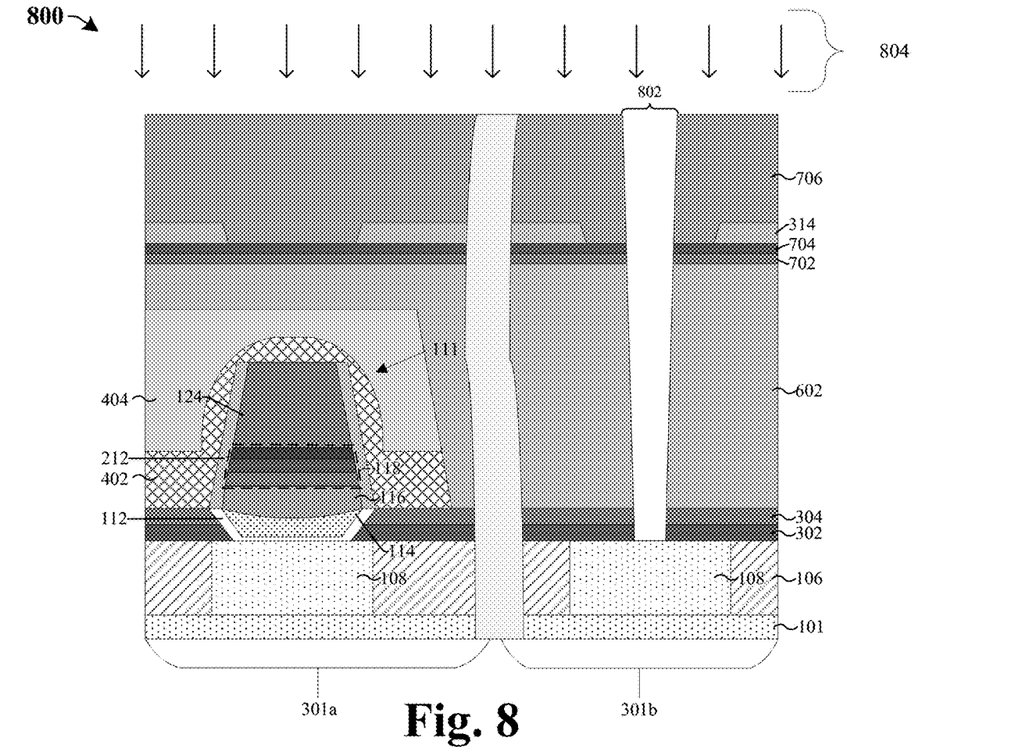

As shown in cross-sectional view 800 of FIG. 8, an etching process is performed to etch the second masking layer 706, the third dielectric 704, the second dielectric 702, the third ILD 602, the first etch stop layer 304, and the dielectric layer 302. The etching process forms an opening 802 that exposes a top surface of the interconnect wire 108 in the logic region 301b. In some embodiments, the etching process may be performed by exposing unmasked areas of the third dielectric 704, the second dielectric 702, the third ILD 602, the first etch stop layer 304, and the dielectric layer 302 to an etchant 804.

Figure 9:
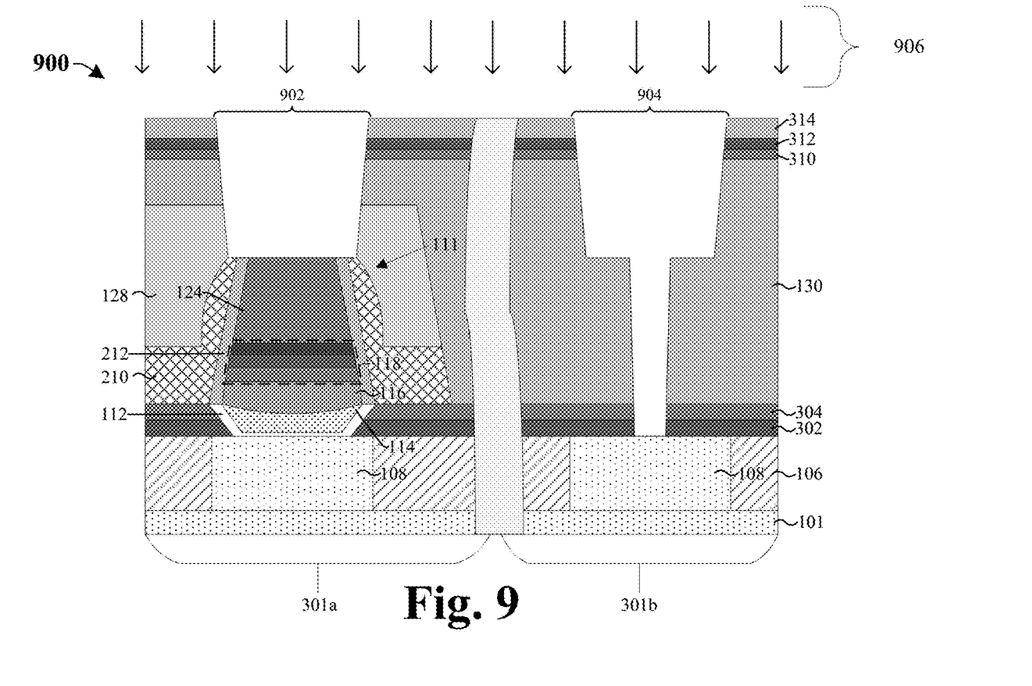

As shown in cross-sectional view 900 of FIG. 9, an etching process is performed to etch the third dielectric (704 of FIG. 8), the second dielectric (702 of FIG. 8), the third ILD (602 of FIG. 8), the second ILD (404 of FIG. 9), and the second sidewall spacer layer (402 of FIG. 8), and define a third dielectric layer 312, a second dielectric layer 310, the third ILD layer 130, the second ILD layer 128, and the second sidewall spacer 210 respectively. In some embodiments, the second dielectric layer 310 may comprise a tetra-ethyl-ortho-silicate (TEOS) layer, for example. In some embodiments, the third dielectric layer 312 is a nitrogen free anti-reflective layer comprising a silicon oxide layer, for example. The etching process forms a first opening 902 directly above the upper electrode 124 that exposes a top surface of the upper electrode 124, the first sidewall spacer 212, and the second sidewall spacer 210. The etching process also forms a second opening 904 directly above the interconnect wire 108 in the logic region 301b. In some embodiments, the etching process may be performed by exposing unmasked areas of the third dielectric 704, the second dielectric 702, the third ILD 602, the second ILD 404, and the second sidewall spacer layer 402 to an etchant 906.

Figure 10:
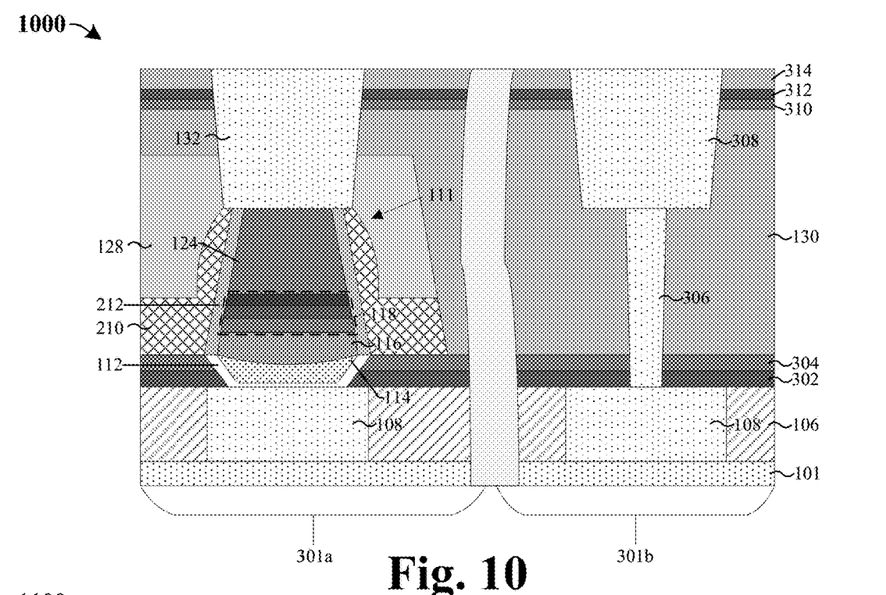

As shown in cross-sectional view 1000 of FIG. 10, the first opening 902 and the second opening 904 are filled with a conductive material. A planarization process (e.g., a CMP process) is subsequently performed to remove excess of the conductive material from over the masking layer 314. The planarization process defines an upper interconnect wire 132 directly above the upper electrode 124 within the embedded memory region 301a and a second conductive via 306 and a second interconnect wire 308 within the logic region 301b. In some embodiments, the planarization process may remove the second dielectric layer 310, the third dielectric layer 312, and the masking layer 314. In other embodiments, one or more of the second dielectric layer 310, the third dielectric layer 312, and the masking layer 314 may remain after the planarization process.

In some embodiments, the upper interconnect wire 132 directly contacts an upper surface of the upper electrode 124 along an interface continuously extending from a first outer edge 210a of the second sidewall spacer 210 to a second outer edge 210b of the second sidewall spacer 210. In some embodiments, the interface is a substantially level horizontal line extending along an upper surface of the second sidewall spacer 210, an upper surface of the first sidewall spacer 212, and the upper surface of the upper electrode 124. In some embodiments, the interface is a multi-level interface extending along an upper surface of the second sidewall spacer 210, an upper surface of the first sidewall spacer 212, and the upper surface of the upper electrode 124 at different heights. In some embodiments, the second conductive via 306 may be comprised of copper. The second interconnect wire 308 is formed over the second conductive via 306. In some embodiments, the upper interconnect wire 132, second conductive via 306, and a second interconnect wire 308 may be comprised of copper, aluminum, or the like. When viewed from a top view, the first sidewall spacer 212 and second sidewall spacer 210 may have a round shape with a curved outer surface. Therefore, the first outer edge 210a and the second outer edge 210b are identified from a cross-sectional view.

Figure 11:
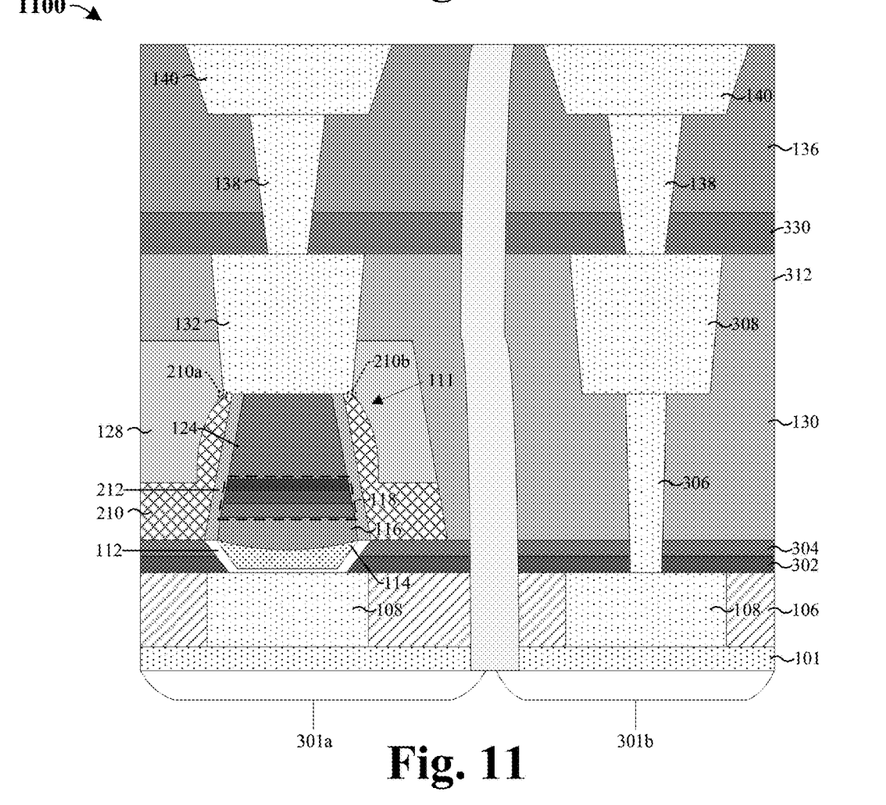

As shown in cross-sectional view 1100 of FIG. 11, a second etch stop layer 330 is formed over the embedded memory region 301a and logic region 301b. A fourth ILD layer 136 is formed over the second etch stop layer 330. A second conductive via 138 is formed over the upper interconnect wire 132 in the embedded memory region 301a and over the second interconnect wire 308 within the logic region 301b. In some embodiments, the second conductive via 138 may be comprised of copper, for example. A second conductive wire 140 is formed over the second conductive via 138. In some embodiments, the second conductive wire 140 may be comprised of copper, for example. The second conductive wire 140 extends past sidewalls of the second conductive via 138.

Figure 12:
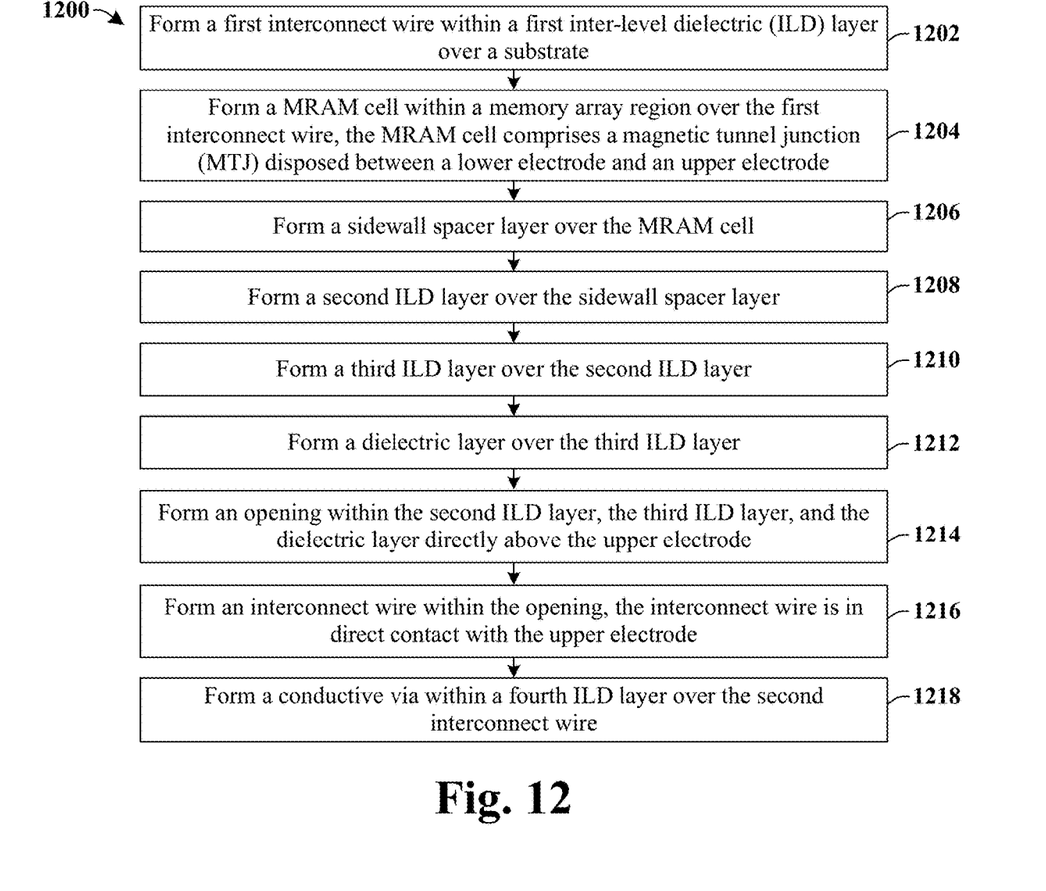
FIG. 12 illustrates a methodology in flowchart format that illustrates some embodiments of a method of forming a memory device including an embedded memory region comprising a MRAM cell having a MTJ and a logic region, according to the present disclosure.

FIG. 12 illustrates a method 1200 of forming a memory device in accordance with some embodiments. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1202, a first interconnect wire is formed within a first inter-level dielectric (ILD) layer over a substrate. FIG. 4 illustrates a cross-sectional view 400 corresponding to some embodiments of act 1202.

At 1204, an MRAM cell is formed within a memory array region over the first interconnect wire, the MRAM cell comprises a magnetic tunnel junction (MTJ) disposed between a lower electrode and an upper electrode. FIG. 4 illustrates a cross-sectional view 400 corresponding to some embodiments of act 1202.

At 1206, a sidewall spacer layer is formed over the MRAM cell. FIG. 4 illustrates a cross-sectional view 400 corresponding to some embodiments of act 1206.

At 1208, a second ILD layer is formed over the sidewall spacer layer. FIG. 4 illustrates a cross-sectional view 400 corresponding to some embodiments of act 1208.

At 1210, a third ILD layer is formed over the second ILD layer. FIG. 6 illustrates a cross-sectional view 600 corresponding to some embodiments of act 1210.

At 1212, a dielectric layer is formed over the third ILD layer. FIG. 7 illustrates a cross-sectional view 700 corresponding to some embodiments of act 1212.

At 1214, an opening is formed within the second ILD layer, the third ILD layer, and the dielectric layer directly above the upper electrode. FIG. 9 illustrates a cross-sectional view 900 corresponding to some embodiments of act 1214.

At 1216, a second interconnect wire is formed within the opening, the interconnect wire is in direct contact with the upper electrode. FIG. 10 illustrates a cross-sectional view 1000 corresponding to some embodiments of act 1216.

At 1218, a conductive via is formed within a fourth ILD layer over the second interconnect wire. FIG. 11 illustrates a cross-sectional view 1100 corresponding to some embodiments of act 1218.

Accordingly, in some embodiments, the present disclosure relates to a method of forming a MRAM cell that comprises forming an interconnect wire directly onto a top surface of a top electrode of the MRAM cell.

In some embodiments, the present disclosure relates to a memory device including: a memory cell overlying a substrate, wherein the memory cell comprises a data storage structure disposed between a lower electrode and an upper electrode; an upper interconnect wire overlying the upper electrode; a first inter-level dielectric (ILD) layer surrounding the memory cell and the upper interconnect wire; a second ILD layer overlying the first ILD layer and surrounding the upper interconnect wire; and a sidewall spacer laterally surrounding the memory cell, wherein the sidewall spacer has a first sidewall abutting the first ILD layer and a second sidewall abutting the second ILD layer.

In other embodiments, the present disclosure relates to an integrated chip including: a first memory cell and a second memory cell overlying a substrate and laterally offset from one another by a first distance, wherein the first and second memory cells include a data storage structure disposed between a bottom electrode and a top electrode, respectively; a plurality of conductive wires overlying the top electrode of the first and second memory cells; a first inter-level dielectric (ILD) layer wrapped around the first and second memory cells and the conductive wires, wherein the first ILD layer comprises sidewalls defining a recess between the first and second memory cells; a dielectric protection layer disposed within the recess such that a top surface of the dielectric protection layer is aligned with a top surface of the first ILD layer; and a sidewall spacer laterally surrounding the first and second memory cell, wherein the sidewall spacer comprises a segment that continuously extends along the first distance, wherein the dielectric protection layer directly overlies the segment of the sidewall spacer.

In yet other embodiments, the present disclosure relates to a method for manufacturing a memory device. The method includes: forming a sidewall spacer around a memory cell located in a memory array region, wherein the memory cell includes a data storage structure disposed between a bottom electrode and a top electrode; forming a first inter-level dielectric (ILD) layer over the sidewall spacer, wherein the first ILD layer is laterally offset from a logic region by a non-zero distance; forming a second ILD layer over the first ILD layer, wherein the second ILD layer extends continuously from the memory array region to the logic region, and wherein a sidewall of the second ILD layer abuts a sidewall of the sidewall spacer; patterning the first and second ILD layers to define a first opening over the top electrode and a second opening within the logic region; and forming a first conductive wire within the first opening and a second conductive wire within the second opening; wherein the first conductive wire abuts the top electrode and the sidewall spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a memory cell overlying a substrate, wherein the memory cell comprises a data storage structure disposed between a lower electrode and an upper electrode;
    an upper interconnect wire overlying and contacting the upper electrode;
    a first inter-level dielectric (ILD) layer surrounding the memory cell and the upper interconnect wire;
    a second ILD layer overlying the first ILD layer and surrounding the upper interconnect wire, wherein a lower surface of the second ILD layer is vertically above the upper electrode and abuts the upper interconnect wire;
    a sidewall spacer laterally surrounding the memory cell, wherein the sidewall spacer has a first sidewall abutting the first ILD layer and a second sidewall abutting the second ILD layer; and
    an interconnect wire disposed within the second ILD layer and laterally offset from the memory cell, wherein a top surface of the upper interconnect wire is aligned with a top surface of the interconnect wire, and wherein a bottommost surface of the interconnect wire is vertically above a bottom surface of the upper electrode and vertically below the lower surface of the second ILD layer.

2. The memory device of claim 1, wherein an upper surface of the sidewall spacer continuously extends from the first sidewall to the second sidewall, wherein the upper surface of the sidewall spacer abuts the first ILD layer.

3. The memory device of claim 2, wherein the upper surface of the sidewall spacer is spaced vertically between a top surface of the data storage structure and a bottom surface of the data storage structure.

4. The memory device of claim 1, wherein the sidewall spacer comprises:
a first sidewall spacer comprising a first material that is disposed along outer sidewalls of the upper electrode; and
a second sidewall spacer comprising a second material that is disposed along outer sidewalls of the first sidewall spacer and that extends over the substrate, wherein the first material is different than the second material.

5. The memory device of claim 4, wherein a top surface of the second sidewall spacer is disposed above a top surface of the first sidewall spacer.

6. The memory device of claim 1, wherein a bottom surface of the upper interconnect wire is aligned with the bottommost surface of the interconnect wire.

7. The memory device of claim 1, wherein a top surface of the upper electrode is disposed along a substantially level horizontal line, and wherein a bottom surface of the upper interconnect wire is disposed along the substantially level horizontal line.

8. The memory device of claim 1, further comprising:
a conductive via directly underlying the interconnect wire, wherein the conductive via continuously vertically extends from the bottommost surface of the interconnect wire to a point vertically below a bottom surface of the lower electrode.

9. An integrated chip, comprising:
a first memory cell and a second memory cell overlying a substrate and laterally offset from one another by a first distance, wherein the first and second memory cells comprise a data storage structure disposed between a bottom electrode and a top electrode, respectively;
a plurality of conductive wires overlying the top electrode of the first and second memory cells;
a first inter-level dielectric (ILD) layer wrapped around the first and second memory cells and the conductive wires, wherein the first ILD layer comprises sidewalls defining a recess between the first and second memory cells;
a dielectric protection layer disposed within the recess such that a top surface of the dielectric protection layer is aligned with a top surface of the first ILD layer, wherein the dielectric protection layer contacts the sidewalls of the first ILD layer defining the recess, wherein a bottommost surface of the dielectric protection layer is disposed above a bottom surface of the top electrode; and
a sidewall spacer laterally surrounding the data storage structure and the top electrode of the first and second memory cell, wherein the sidewall spacer comprises a segment that continuously extends along the first distance, wherein the dielectric protection layer directly overlies the segment of the sidewall spacer.

10. The integrated chip of claim 9, wherein the dielectric protection layer is spaced laterally between sidewalls of the sidewall spacer.

11. The integrated chip of claim 9, wherein a top surface of the sidewall spacer is disposed beneath the top surface of the dielectric protection layer.

12. The integrated chip of claim 9, further comprising:
an etch stop layer overlying the first ILD layer, wherein the etch stop layer laterally surrounds the conductive wires, and wherein the top surface of the dielectric protection layer and the top surface of the first ILD layer abut a bottom surface of the etch stop layer.

13. The integrated chip of claim 12, wherein a top surface of the top electrode of the first and second memory cells is aligned with the top surface of the first ILD layer.

14. The integrated chip of claim 9, wherein a first conductive wire in the plurality of conductive wires contacts a top surface of the top electrode of the first memory cell and extends along opposing sidewalls of the top electrode of the first memory cell.

15. The integrated chip of claim 9, further comprising:
a second ILD layer overlying the first ILD layer and laterally enclosing the plurality of conductive wires;
wherein a first sidewall of the sidewall spacer contacts the first ILD layer and a second sidewall of the sidewall spacer contacts the second ILD layer.

16. The integrated chip of claim 9, wherein the dielectric protection layer continuously extends from the sidewalls of the first ILD layer to an upper surface of the first ILD layer.

17. An integrated chip, comprising:
a memory cell overlying a substrate, wherein the memory cell comprises a data storage structure disposed between a lower electrode and an upper electrode;
a first sidewall spacer laterally enclosing the memory cell;
a second sidewall spacer laterally enclosing the first sidewall spacer;
a first dielectric structure surrounding the memory cell and the second sidewall spacer; and
an interconnect wire extending through the first dielectric structure and overlying the upper electrode, wherein the interconnect wire comprises a first protrusion that is disposed laterally between a sidewall of the upper electrode and an inner sidewall of the second sidewall spacer, wherein a bottom surface of the first protrusion is disposed along a top surface of the first sidewall spacer, wherein the interconnect wire comprises a second protrusion that is disposed along an outer sidewall of the second sidewall spacer, wherein the second sidewall spacer is disposed laterally between the first protrusion and the second protrusion, and wherein the bottom surface of the first protrusion is vertically above a bottom surface of the second protrusion.

18. The integrated chip of claim 17, wherein the interconnect wire continuously extends from the outer sidewall of the second sidewall spacer, along a top surface of the second sidewall spacer, to the inner sidewall of the second sidewall spacer.

19. The integrated chip of claim 17, wherein the top surface of the first sidewall spacer is vertically below a top surface of the second sidewall spacer.

20. The integrated chip of claim 17, wherein the second protrusion is spaced laterally between a topmost edge of the second sidewall spacer and the first dielectric structure.

* * * * *